United States Patent [19]

Asada et al.

[11] Patent Number: 5,665,651
[45] Date of Patent: Sep. 9, 1997

[54] PROCESS FOR ENCAPSULATING A SEMICONDUCTOR DEVICE AND LEAD FRAME

[75] Inventors: Junichi Asada, Yokkaichi; Masahiko Hori, Yokohama; Shinji Takei, Tokyo, all of Japan

[73] Assignee: Kabushiki Kaisha Toshiba, Kawasaki, Japan

[21] Appl. No.: 545,179

[22] Filed: Oct. 19, 1995

Related U.S. Application Data

[62] Division of Ser. No. 467,533, Jun. 7, 1995, Pat. No. 5,493,151, which is a continuation of Ser. No. 273,323, Jul. 11, 1994, abandoned.

[30] Foreign Application Priority Data

Jul. 15, 1993 [JP] Japan .................. 5-197938

[51] Int. Cl.$^6$ .................. H01L 21/56; H01L 21/58; H01L 21/60
[52] U.S. Cl. .................. 29/827; 438/123; 438/124
[58] Field of Search .................. 437/207, 214, 437/217, 220, 974; 148/DIG. 135

[56] References Cited

U.S. PATENT DOCUMENTS

| | | | |
|---|---|---|---|
| 4,660,127 | 4/1987 | Gunter | 437/217 |
| 5,134,458 | 7/1992 | Tsutsumi et al. | 257/666 |
| 5,134,773 | 8/1992 | LeMaire et al. | 437/217 |
| 5,299,092 | 3/1994 | Yaguchi et al. | 257/686 |

FOREIGN PATENT DOCUMENTS

| | | | |
|---|---|---|---|
| 60-7259 | 1/1985 | Japan | |
| 60-138929 | 7/1985 | Japan | |
| 60/240153 | 11/1985 | Japan | 257/686 |
| 3-173167 | 7/1991 | Japan | 257/686 |
| 4-53252 | 2/1992 | Japan | |

*Primary Examiner*—David E. Graybill
*Attorney, Agent, or Firm*—Finnegan, Henderson, Farabow, Garrett & Dunner, L.L.P.

[57] ABSTRACT

Outer leads are buried in a package. At least the contact portions of the outer leads which are connected to a circuit board are exposed from the package and the exposed portions make the same flat surfaces as the package surface. When forming the package, the outer leads are used as the side wall of a mold forming mold, and therefore, they are formed thicker than inner leads inside the package. Thus, the package thickness can be made equal to the thickness of the outer leads.

6 Claims, 7 Drawing Sheets

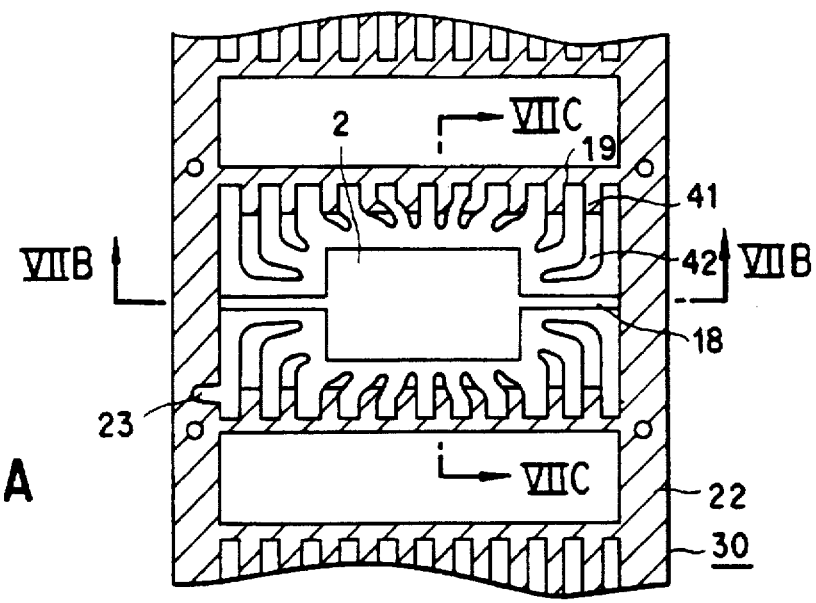
F I G. 7A
F I G. 7B
F I G. 7C
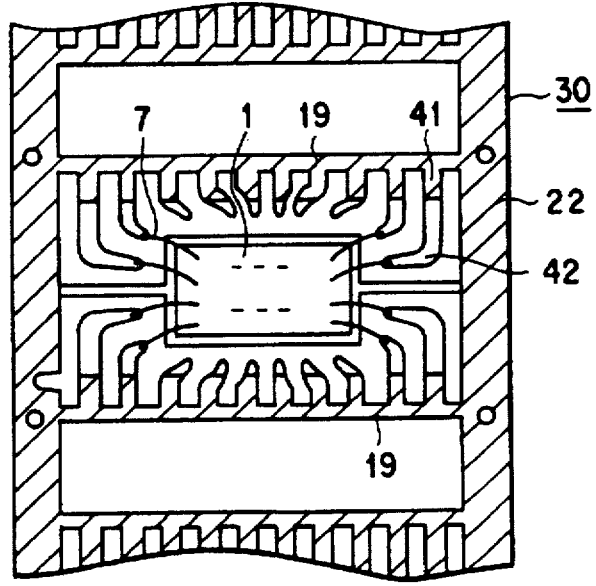
F I G. 8

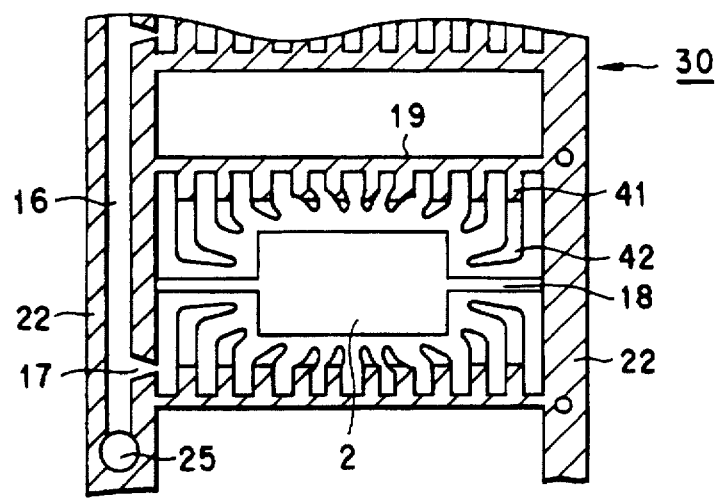
F I G. 12
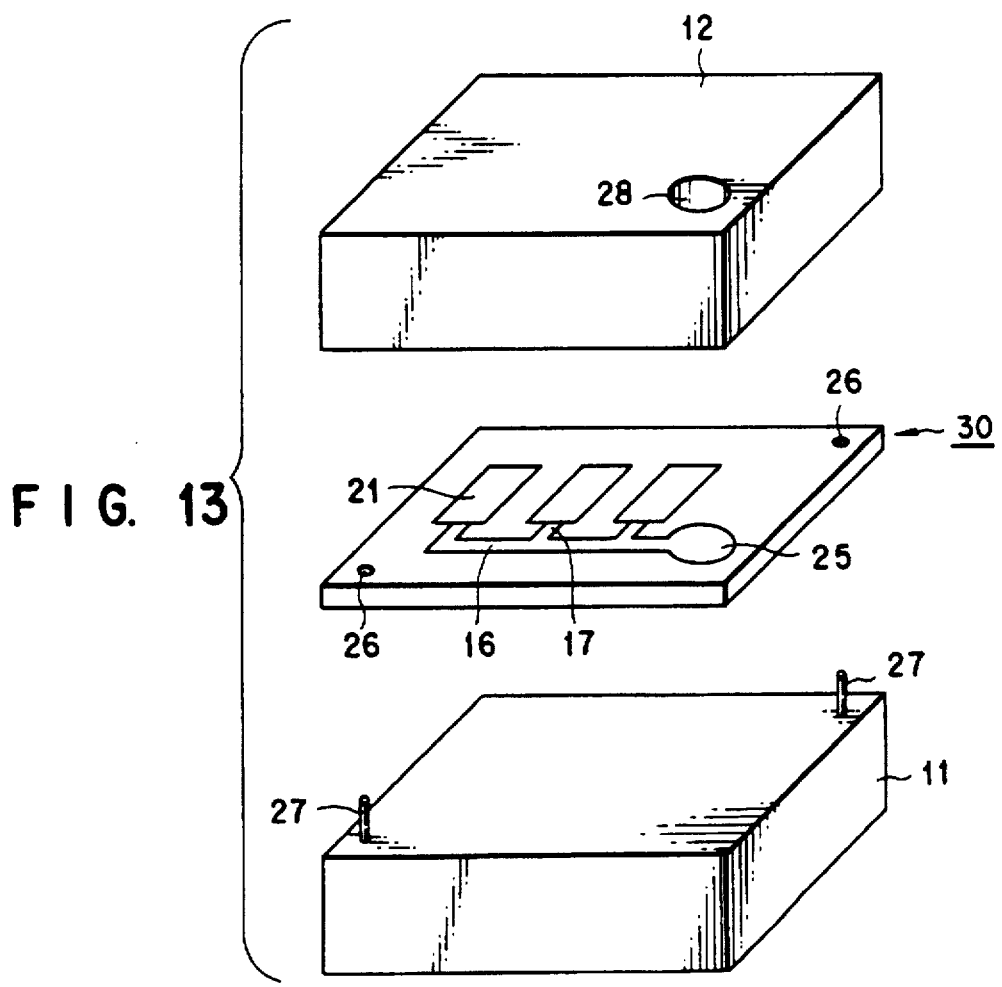
F I G. 13

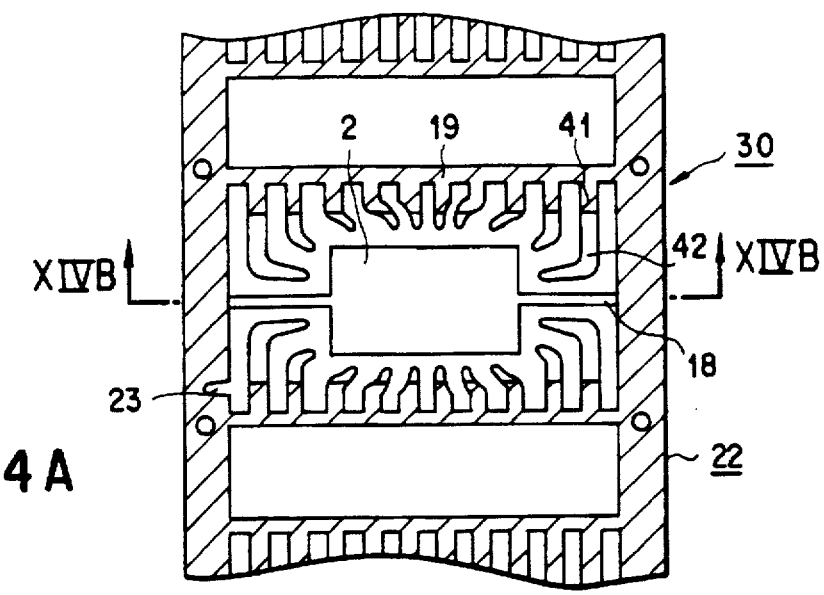
F I G. 14A
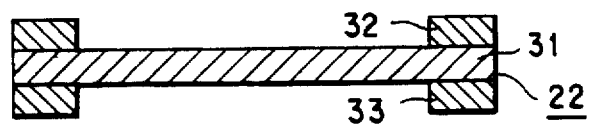
F I G. 14B
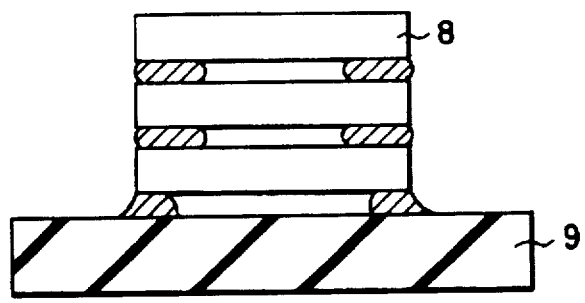
F I G. 15
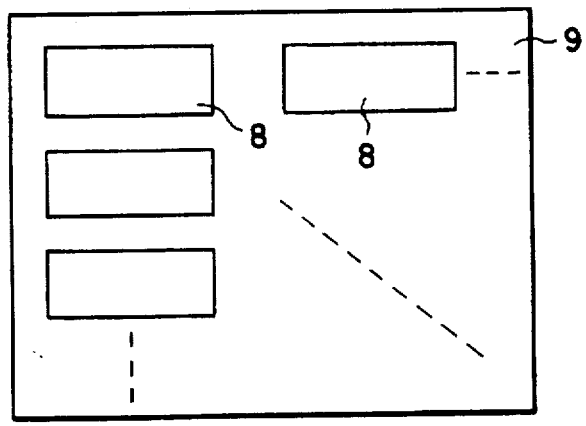
F I G. 16

PROCESS FOR ENCAPSULATING A SEMICONDUCTOR DEVICE AND LEAD FRAME

This is a division of application Ser. No. 08/467,533, filed Jun. 7, 1995, U.S. Pat. No. 5,493,156 which is a continuation of application Ser. No. 08/273,323, filed Jul. 11, 1994, now abandoned.

BACKGROUND OF THE INVENTION

1. Field of the Invention

This invention relates to a plastic seal packaged semiconductor device capable of attaining high-density mounting, and more particularly to the plastic seal structure of a semiconductor device of reduced thickness, lead frame and a method of manufacturing the plastic seal structure.

2. Description of the Related Art

A semiconductor device such as an IC or LSI is packaged to protect the semiconductor substrate (chip) having semiconductor elements formed thereon from contamination source such as dusts, chemicals, gases and moisture and the mechanical damage. The package used for this purpose is required to have various characteristics including a high degree of hermetic sealing, high resistance to the high temperature condition set in the assembling step, high mechanical strength, chemical stability and excellent electrical characteristics such as insulation characteristic and high-frequency characteristic, for example, and synthetic resin or ceramics is used as the material of the package.

FIG. 1 is across sectional view showing plastic mold forming molds 11, 12 for forming a plastic package, a lead frame 30 disposed in a space defined by the molds, and a chip 1 mounted on the semiconductor chip mounting portion (island) 2 of the lead frame 30. FIG. 2 is a cross sectional view of a packaged SOP (Small Outline Package) type semiconductor device. Conventionally, the package for attaining the high-density mounting of a semiconductor device includes a QFP (Quad Flat Package) whose outer lead is of gull-wing type and a PLCC (Plastic Leaded Chip Carrier) whose outer lead is of J type, and further includes a TQFP (Thin Quad Flat Package) and a TSOP (Thin Small Outline. Package) whose package thickness is reduced to enhance the spatial mounting density and is approx. 1.0 mm or less.

The chip 1 mounted on any type of lead frame is plastic-molded by synthetic resin 8.

A conventional semiconductor device having a package formed of synthetic resin and a method for forming the package thereof are explained with reference to FIGS. 1 and 2. As shown in FIG. 1, the chip 1 having a semiconductor element such as a memory formed thereon is fixed on the chip mounting portion 2 of the lead frame 30 by use of adhesive agent 3. The chip 2 has leads 4 for connecting the chip 1 to an external circuit. In general, bonding portions 5 are formed on respective inner leads 42 of the lead 4 and electrode pads 6 are formed on the surface of the chip 1. The bonding portions 5 are electrically connected to the electrode pads 6 via respective bonding wires 7 of Al or Au.

The chip 1, chip mounting portion 2, bonding wires 7, and inner leads 42 of the lead 4 are packaged by use of molding resin by a transfer molding method, for example. In order to form a package 8 for the packaging, a mold 10 shown in FIG. 1 is used. The mold 10 includes a drag 11 and cope 12 which respectively have cavities 13 and 14. The lead frame 30 is disposed between the drag 11 and the cope 12 such that the chip 1, chip mounting portion 2, bonding wires 7 and the like may be arranged in a concave portion defined by the cavities of the drag and cope, and then mold resin 81 supplied from the exterior is injected into the concave portion via a runner 16 and a gate 17 which are formed in the drag 11 so as to form the package 8 shown in FIG. 2. After this, tie bars 19, 23 of the lead frame 30 (refer to FIG. 3) for preventing the outflow of resin at the time of formation of the package, chip mounting portion supporting member 18 and other unnecessary portions are removed, and then outer lead portions 41 of the lead 4 which extend outwardly from the package 8 are plated and bent into a preset lead form so as to complete the semiconductor device of FIG. 2. The front end portions of the outer lead portions 41 of the lead 4 of the semiconductor device are electrically connected to corresponding wiring layers of the circuit board by soldering, for example. Thus, the semiconductor device is mounted on the circuit board 9.

In the above semiconductor device, since the leads exposed from the package are not fixed in the package having a gull wing type lead form, the leads are easily bent, providing a large obstacle to the attainment of smaller pitch size. In the J type PLCC, the degree of bending of the leads can be suppressed by forming a pocket in the rear surface of the package and bending the lead terminals into the pocket, but the thickness of the package must be made large enough to form the pocket therein and it is difficult to make the wall thickness of the package equal to or less than 1 mm. It is generally known that the leads extending outwardly from the side surface of the package are weak to mechanical shock. Further, the leads extending from the package of thin type are of gull wing type, and if a semiconductor device having a package with a package thickness T of 1 mm is mounted on the circuit board 9 as shown in FIG. 2, a space is formed between the bottom surface of the package and the surface of the circuit board 9 and the distance therebetween is as long as 100 to 200 μm and is not constant. When a memory card is formed, a plurality of such semiconductor devices are stacked on the circuit board, and therefore, it is extremely important to make the space small and suppress a variation in the size of the space to minimum.

In order to enhance the mechanical strength of the leads exposed from the package, that is, the outer leads, it is proposed to make the thickness of the outer lead, larger than that of the lead portions (inner leads) buried in the package (refer to Jpn. Pat. Appln. KOKAI Publication No. 4-53252). With this technique, the outer lead is formed with a swelling portion having an increased thickness and is formed to extend outwardly with the swelling portion fixed on the side wall and bottom wall of the package by use of resin. However, even if the mechanical strength is enhanced as described above, the outer leads are formed to extend out from the package and cannot sufficiently cope with the high-density mounting which will be further enhanced. Further, in the package forming step, a normal mold is used, but the mold must be formed with openings for permitting passage of the swelling portions of the outer leads. Since the plastic molding is effected with the inner leads disposed between the cope and drag of the mold, a space corresponding to the thickness of the leads is provided between the cope and drag and the resin may flow out from the space in some cases. In order to prevent the outflow, it is necessary to form openings in one of the cope and drag of the mold. In addition, the mold itself is not designed to make the thickness of the package thin.

SUMMARY OF THE INVENTION

This invention has been made in order to solve the above problem and an object of this invention is to provide a semiconductor device capable of increasing the plane and spatial mounting density and preventing the bending of leads, a method for manufacturing the semi-conductor device, and a lead frame of novel structure used for forming the semiconductor device.

This invention has a feature that outer leads are buried in the package, at least the contact portions of the outer leads which are connected to the circuit board are exposed from the package, and the exposed portions of the outer leads make substantially a flat surface together with the package surface, that is, make substantially the same surface as the package surface. Further, this invention has a feature that portions of increased thickness whose thickness is increased in the upward and downward directions (directions perpendicular to the extending direction of the inner leads) of the chip mounting portion of the lead frame and the inner leads around the chip mounting portion from the chip mounting portion and inner leads are formed in an area around the chip mounting portion and inner leads so as to surround the chip mounting portion and inner leads. Also, this invention has a feature that a mold having a cope and a drag in which cavity portions in the facing surfaces and portions near the cavity portions are made flat is used for forming the semiconductor device, a lead frame is disposed between the cope and the drag and the portions of increased thickness are used as a side wall for forming a cavity. That is, a semiconductor device of this invention has a first feature that it comprises a semiconductor chip; a package for covering the semiconductor chip; inner leads electrically connected to the semiconductor chip and covered with the package; and outer leads which are made thicker than the inner leads and integrally formed with the inner leads and whose surfaces are partly exposed from the package; wherein the surfaces of the outer leads are exposed in the upper surface, bottom surface and side surface of the package and make substantially the same surfaces as the upper surface, bottom surface and side surface of the package.

The lead frame of this invention has a feature that the outer leads extend in the upward and downward directions of the inner leads and are formed thicker than the inner leads. Further, the lead frame of this invention has a second feature that it comprises two frame portions formed on both sides; tie bars separately disposed and connecting the frame portions on both sides; a chip mounting portion disposed in an area defined by the frame portions and the tie bars; a chip mounting portion supporting member for connecting the chip mounting portion to the frame portion and supporting the chip mounting portion; outer leads extending in a direction from the tie bar towards the chip mounting portion; inner leads connected at one end to the respective outer leads and disposed at the other end near the chip mounting portion; wherein the chip mounting portion and inner leads are formed thinner than the outer leads, tie bars and frame portion. The lead frame is formed by combining upper and lower lead frames of uniform thickness each including the tie bar, frame portion, part of the chip mounting portion supporting member, and outer leads with the upper and lower surfaces of a main frame of uniform thickness including the tie bar, frame portion, chip mounting portion, chip mounting portion supporting member, outer leads and inner leads.

A method for manufacturing the semiconductor device of this invention has a feature that it comprises a step of mounting a semiconductor chip on a lead frame, inserting the lead frame between facing flat surfaces of a cope and a drag constructing a mold forming mold, and forming a cavity by use of the above flat surfaces, and a frame portion, tie bars and outer leads of the lead frame; a step of injecting mold resin into the cavity and curing the same to form a package of mold resin; and a step of removing the lead frame from the mold forming mold, cutting off peripheral portions of the resin mold of the lead frame to expose the same in the upper surface, lower surface and side surface of the package, thus forming the outer leads whose surfaces make substantially the same plane as the upper, lower and side surfaces of the package. It is possible to further provide a step of forming a runner and a gate for supplying the mold resin into the cavity in the mold forming mold or in the frame portion of the lead frame. It is further possible to provide a step of forming a projecting portion which abuts against the cope of the mold forming mold and has substantially the same thickness as or slightly higher than the outer leads of the lead frame, tie bars, and frame portion on the drag of the mold forming mold.

The cavity portions of the cope and drag constructing the mold forming mold and portions near the cavity portions are made in a flat plate form and no concave portions are formed in the facing surfaces of the mold forming mold. The lead frame having a portion of increased thickness is inserted between the cope and the drag and is resin-sealed. At this time, the portion of increased thickness of the lead frame cooperates with the facing surfaces of the cope and drag to define a cavity in which the chip and inner leads are disposed. The portion of increased thickness forms the side wall of the cavity. Since resin forming the package is filled into the cavity, the thickness of the portion of increased thickness becomes equal to the thickness of the package.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments below, serve to explain the principles of the invention.

FIGS. 7A, 7B and 7C are a plan view of a lead frame used in the first embodiment and cross sectional views taken along the line VIIB—VIIB and the line VIIC—VIIC, respectively;

FIG. 8 is a plan view of a lead frame having a chip mounted thereon and used in the first embodiment;

FIG. 12 is a plan view of a lead frame used in a second embodiment;

FIG. 13 is an exploded perspective view of a mold forming mold having a lead frame mounted thereon;

FIGS. 14A and 14B are a plan view of a lead frame used in a third embodiment and a cross sectional view taken along the line XIVB—XIVB, respectively;

FIG. 15 is a cross sectional view of a circuit board having a resin mold semiconductor device mounted thereon; and FIG. 16 is a plan view of a circuit board having a resin mold semiconductor device mounted thereon.

DETAILED DESCRIPTION OF THE PREFERRED EMBODIMENTS

There will now be described an embodiment of this invention with reference to the accompanying drawings.

Figure 4:
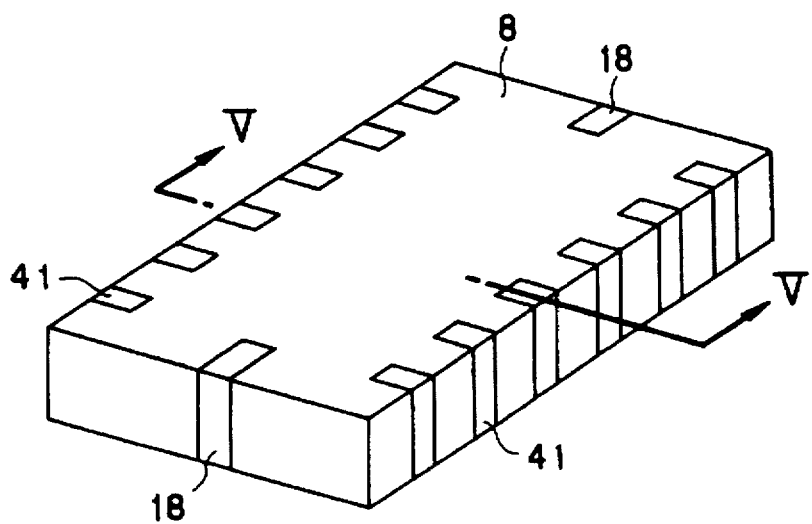
FIG. 4 is a perspective view of a semiconductor device of a first embodiment of this invention.
Figure 5:
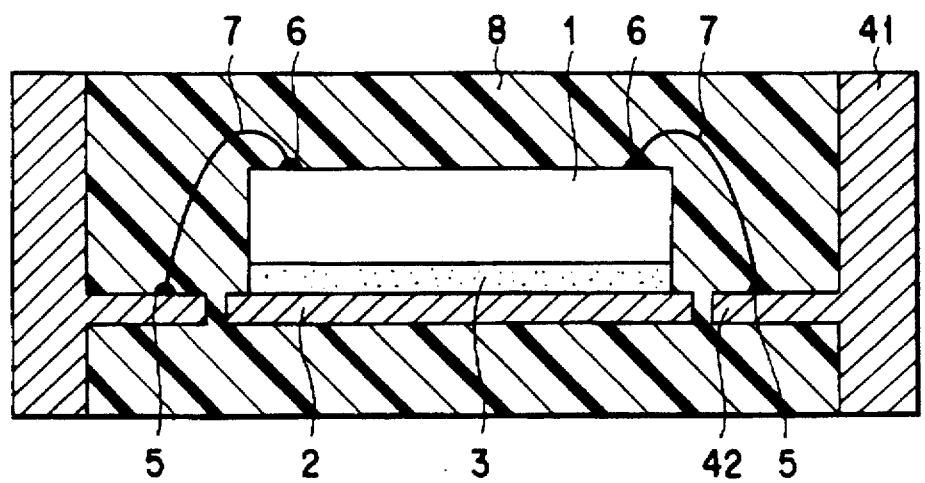
FIG. 5 is a cross sectional view taken along the line V—V of the semiconductor device of the first embodiment of FIG. 4.
Figure 6A:
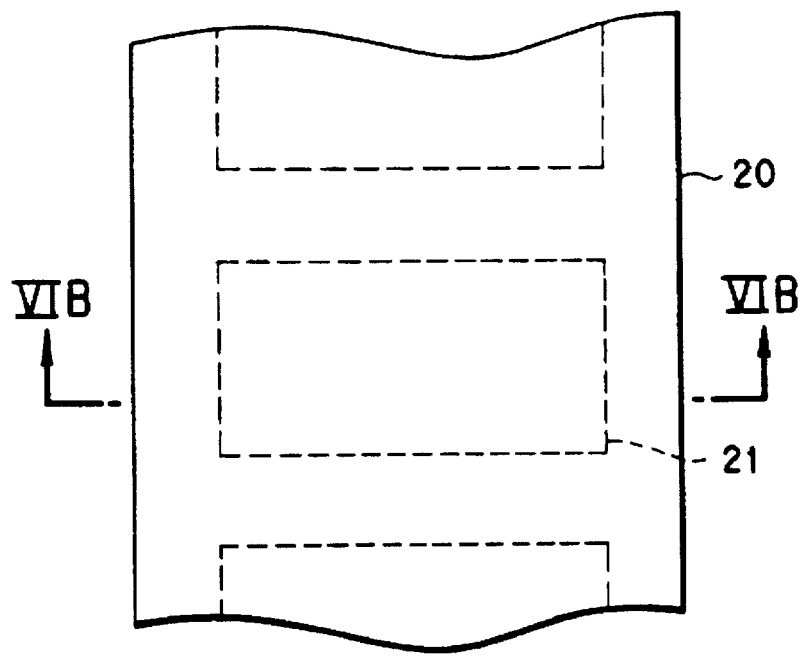
FIGS. 6A and 6B are a plan view and a cross sectional view of a lead frame member used in the first embodiment.
Figure 6B:
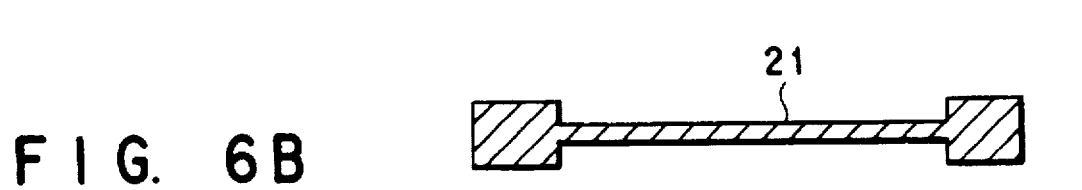
Figure 9:
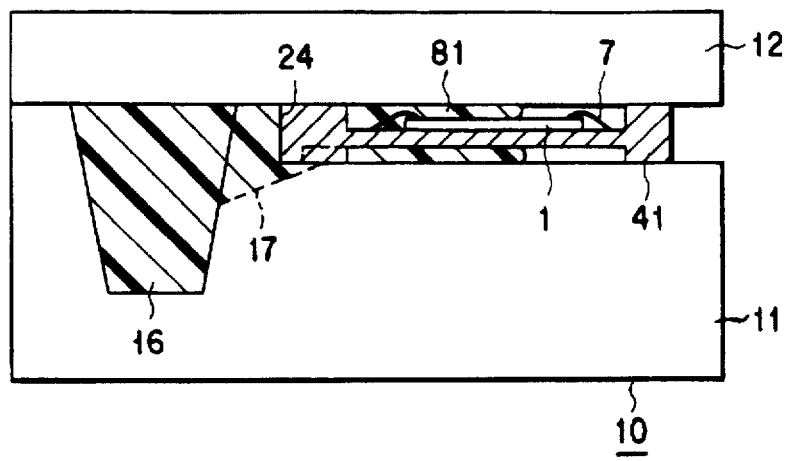
FIG. 9 is a cross sectional view of a mold forming mold used in the first embodiment and having a chip mounted lead frame disposed therein.
Figure 10:
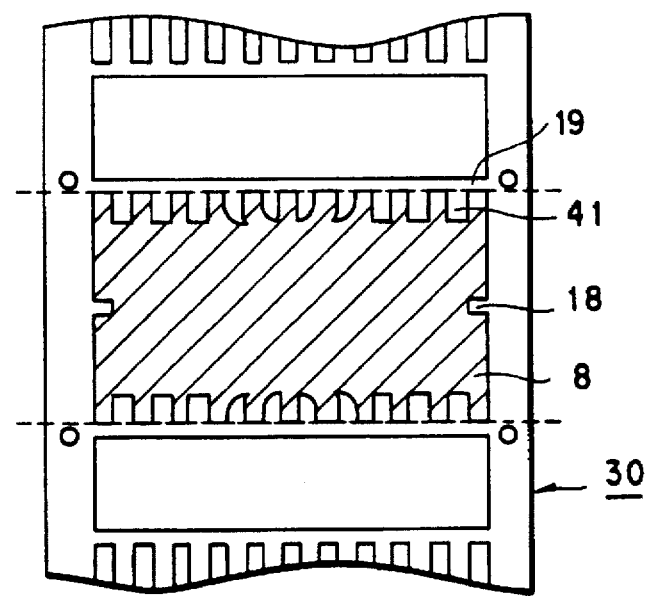
FIG. 10 is a plan view of a resin-molded lead frame used in the first embodiment.
Figure 11:
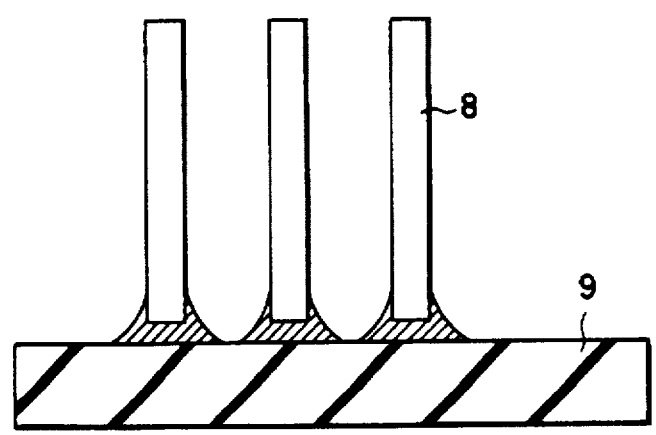
FIG. 11 is a cross sectional view showing a circuit board having a resin-molded chip of first embodiment mounted thereon.

First, the first embodiment of this invention is explained with reference to FIGS. 4 to 11. FIG. 4 is a perspective view of a semiconductor device manufactured according to this invention, FIG. 5 is a cross sectional view taken along the line V—V of the semiconductor device of FIG. 4, FIG. 6A is a plan view of a metal plate for forming a lead frame, FIG. 6B is a cross sectional view taken along the line VIB—VIB of FIG. 6A, FIG. 7A is a plan view of a lead frame formed of the metal plate shown in FIGS. 6A, 6B, FIGS. 7A and 7B are cross sectional views taken along the line VIIB—VIIB and the line VIIC—VIIC of FIG. 7A, FIG. 8 is a plan view of a lead frame having a chip mounted thereon, FIG. 9 is a view showing a mold forming mold used for resin-molding a lead frame having a chip mounted thereon, FIG. 10 is a plan view of a resin-molded lead frame, and FIG. 11 is a cross sectional view showing a circuit board having a resin-molded chip of this invention mounted thereon.

A package 8 formed by resin-molding a chip 1 and a lead frame is formed of epoxy resin or the like and the exterior shape thereof is a rectangular parallelepiped whose surface is flat. A plurality of outer leads 41 are arranged on two side surfaces of the package 8 facing each other in the lengthwise direction and a chip mounting portion supporting member 18 having a chip mounting portion mounted thereon is exposed in two side surfaces of the package facing each other in the lateral direction. The outer leads 41 are exposed in the upper surface, side surface and bottom surface of the package 8 and the exposed surface of each of the outer leads makes substantially a flat surface together with the corresponding package surface, that is, makes substantially the same plane as the corresponding package surface. As shown in FIG. 5, the outer lead 41 is formed to be thicker than the chip mounting portion 2 and inner lead 42 and has a thickness of approx. 0.5 mm. The thickness of the chip mounting portion 2 and inner lead 42 is approx. 0.15 mm and the thickness of a chip bonded to the chip mounting portion 2 by use of adhesive agent 3 is approx. 0.2 mm. Since the drawings are shown in a schematic form, the relation between the above thicknesses is not always precisely shown in the drawings.

Bonding wires 7 such as Au lines for connecting the chip 1 inner leads 42 and electrode pads 6 of the chip to the bonding portions 5 of the inner leads are molded by synthetic resin 8 such as epoxy resin.

The semiconductor device is formed by cutting off the unnecessary portions of the lead frame after molding the package on the lead frame. After this, solder layers are formed on the surfaces of the outer leads 41 by the solder dip process. A plurality of the semiconductor devices can be stacked on one another by melting the solder layers and electrically connected to one another without using circuit boards. Further, when the semiconductor device is mounted on a circuit board, the package 8 is so placed that the side surface thereof may be set to face the circuit board 9 as shown in FIG. 11 and the package can be fixedly bonded to the circuit board by soldering.

Next, a method of manufacturing the semiconductor device shown in FIG. 4 and 5 is explained. First, a metal plate 20 with a thickness of 0.5 mm formed of Fe alloy containing Ni by 42 wt % is prepared. Portions of the metal plate which correspond to the chip mounting portion of the lead frame and wire bonding portions around the chip mounting portion are selectively etched out by a preset thickness by use of etching solution so as to form a thin portion 21. The portion other than the thin portion 21 is a thick portion with a thickness of 0.5 mm. The thin portion 21 can be formed by the press working instead of the etching process (FIGS. 6A, 6B).

After-this, the chip mounting portion 2, the inner leads 42 of the thin portion formed to surround the chip mounting portion 2, the outer leads 41 of the thick portions, frame portions 22 of the thick portion formed on both side portions of a lead frame, the chip mounting portion supporting member 18 of the thin portion 21 for connecting the chip mounting portion 2 to the frame portions 22, the tie bars 19 of the thick portion for supporting the outer leads 41, a gate portion 23 formed by stamping out part of the frame portion 22 of the thick portion and the like are formed in the punching step or the like to form a lead frame 30 (FIGS. 7A to 7C). The outer leads 41 are formed to extend from the tie bar 19 towards the chip mounting portion.

Next, a chip is mounted on the lead frame 30. That is, the chip 1 is fixed on the chip mounting portion 2 by use of adhesive agent, for example. After the chip 1 is mounted on the chip mounting portion 2, the electrode pads of the chip 1 are connected to the end portions of the inner leads 42 via bonding wires 7 such as Au lines (FIG. 8).

After this, the lead frame on which the chip is mounted and to which the chip is electrically connected via the bonding wires is placed in the mold forming mold 10 having the drag 11 and cope 12 (FIG. 9). As shown in FIG. 9, a space corresponding to the thickness of the outer lead 41 of the lead frame is provided between the drag 11 and the cope 12. For brevity of the drawing, the adhesive agent for bonding the chip 1 on the lead frame and a difference between the chip mounting portion and the inner leads are not shown in FIG. 9.

A stepped portion (or concave portion) 24 is formed in part of the surface of the drag 11 which faces the cope. A runner 16 and a gate 17 for injecting mold resin are formed in the stepped portion. The height of the stepped portion 24 is substantially equal to or slightly smaller than the thickness of the lead frame. For example, in a case where a lead frame formed of a metal plate with a thickness of 0.5 mm is molded, it is preferable to use a mold forming mold having the stepped portion 24 whose height is equal to or slightly smaller than 0.5 mm. When the mold forming mold is used and the drag 11 is set in close contact with the cope 12, a portion of the lead frame to be held is fixed between the drag and the cope with a constant force. Further, since the stepped portion 24 is set in close contact with the surface of the cope 12, there occurs no possibility that resin flowing in the runner 16 and gate 17 will leak into unwanted portions before it is supplied into the cavity. The cope 12 has a flat surface and that portion of the drag 11 on which the lead frame is placed is also made flat. However, the runner 16 and gate 17 are formed in a portion of the drag 11 adjacent to that portion thereof on which the lead frame is placed. The thick portion surrounded by the thin portion 21 (refer to FIGS. 6A, 6B) of the lead frame is set in close contact with the drag 11 and cope 12.

In FIG. 9, the outer leads 41, tie bars 19 and frame portion 22 correspond to the thick portion and define a space which constitutes a cavity. Mold resin 81 injected from the exterior is supplied from the runner 16 into the gate 17 and then injected into the cavity via the gate portion 23 of the lead frame 30 shown in FIGS. 7A to 7C. The mold resin 81 is fully filled into the cavity to form a package 8 of mold resin in which the outer leads 41, the end portions of the chip mounting portion supporting members 18 and the tie bars 19 shown in FIG. 10 are exposed. When the mold formation is effected by use of the above mold forming mold, the inner leads, chip mounting portion supporting members and the like can be fixed by clamping the mold forming mold, and therefore, there occurs no problem that the chip mounting portion floats in the cavity at the time of resin molding or the inner leads are set in contact with each other, thereby making it possible to effect the transfer mold formation of an extremely thin package. After the lead frame 30 is resin-molded, unwanted portions of the lead frame, that is, portions which do not form the leads are removed to complete a semiconductor device (FIG. 5). Since the lead frame 30 is cut apart along the boundary line between the thick portion and the inner leads 41, that is, along the periphery of the package (as indicated by broken lines in FIG. 10), the outer leads 41 will not project from the package 8. Therefore, when a plurality of semiconductor devices are mounted on the circuit board, the height thereof can be suppressed to minimum. After the mold formation, thin burrs on the surfaces of the exposed portions of the outer leads are removed, the plating is effected and the tie bars 19 are cut off so as to form the semiconductor device of this invention shown in FIGS. 4 and 5.

Next, a second embodiment is explained with reference to FIGS. 12 and 13. FIG. 12 is a plan view of a lead frame, and FIG. 13 is an exploded perspective view of a mold forming mold having the lead frame of FIG. 12 mounted thereon. This embodiment has a feature in the shape of the lead frame. In the first embodiment, the runner and gate for injecting resin into the cavity are formed in the drag, but in this embodiment, the runner and gate are formed in the lead frame 30. The lead frame has frame portions 22 on both sides thereof and a chip mounting portion 2, chip mounting portion supporting members 18, tie bars, 19, outer leads 41, and inner leads 42 disposed between the frame portions. The width of one (frame portion on the left side in the drawing) of the frame portions 22 of the lead frame is set to approximately twice the width of the other frame portion 22 (frame portion on the right side in the drawing). The runner 16 and gate 17 are formed in the left-side frame portion 22 in positions outside feeding holes (not shown for brevity of the drawing). They are formed at the same time of formation of the thin portion in the etching step of forming the thin film portion 21 (refer to FIGS. 6A, 6B) in the surface of the lead frame facing the cope 12.

In the lead frame 30 of FIG. 13, the thin portion 21 forms the cavity as shown in FIGS. 6A, 6B and the runner 16, gate 17 and resin injecting hole 25 are also formed in the etching step of forming the thin portion 21.

The lead frame 30 has an adequate number of positioning holes 26 formed in adequate positions (a pair of corner portions in the drawing) on both sides thereof and corresponding to positioning pins 27 fixed on the surface of the drag 11. The positioning can be attained by forming a concave portion for receiving the lead frame corresponding in position to the frame portion the mold forming mold instead of using the positioning pins as in this embodiment.

The lead frame 30 can be disposed between the cope 12 and the drag 11. Portions of the drag 11 and cope 12 which are set in contact with the lead frame are made flat. A resin injection hole 28 is formed in the cope 12 corresponding in position to the resin injection hole 25 of the lead frame 30 and resin is injected via the holes. Resin is injected via the resin injection hole 25 of the lead frame 30, passes the runner 16 and is supplied into the cavities via the respective gates 17.

Next, a third embodiment is explained with reference to FIGS. 14A, 14B. FIGS. 14A and 14B are a plan view of a lead frame and a cross sectional view taken along the line XIVB—XIVB of FIG. 14A. The lead frame 30 is formed at a fine pitch (approx. 0.3 mm). Like the lead frame of FIGS. 7A to 7C, the chip mounting portion and inner lead portion of the lead frame are formed thinner than the other portion so that the chip mounting portion and inner lead portion will make a cavity when the lead frame is set in the mold forming mold, but a method for manufacturing the lead frame is different. Since the lead frame with a fine pitch is formed by the etching process, the frame thickness must be set to 0.15 mm which is the same as the interval between the leads when the frame thickness is set to such a small value of 0.15 mm, the mold formation becomes difficult without using a special means. In this embodiment, the thicknesses of respective portions of the lead frame are adjusted by stacking three thin metal plates. The metal plates are bonded by welding. It is not necessarily required to bond the metal plates. The metal plates may be superposed when the lead frame is set in the mold molding mold. A main lead frame 31 constituting the lead frame is formed of an Fe alloy containing Ni by 42 wt % and disposed between upper and lower two metal plates 32 and 33. The main lead frame 31 has a uniform thickness of 0.15 mm. The lead frame 30 has the main lead frame 31, frame portions 22 formed on both sides thereof, and a chip mounting portion 2, chip mounting portion supporting members 18 for supporting the chip mounting portion on the frame portions 22, tie bars 19 for supporting the leads, gate portion 23, outer leads 41, and inner leads 42 which are formed between the frame portions 22.

The upper and lower metal plates, that is, upper and lower lead frames 32 and 33 are formed of Cu, for example, and the film thickness of any part of them is approx. 0.15 mm. However, the thicknesses of the lead frames 32, 33 do not necessarily have the same value. For example, the upper lead frame 32 can be formed with a larger thickness and the lower lead frame 33 can be formed with a smaller thickness. With this structure, a space for permitting the chip and bonding wires to be sufficiently covered with resin mold can be made without increasing the package thickness. The upper and lower lead frames are welded on the upper surface and rear surface of the main lead frame 31. Each of the upper and lower lead frames includes frame portions 22 formed on both sides thereof, part of the chip mounting portion supporting members 18 for supporting the chip mounting portion on the frame portions, tie bars 19 for supporting the leads, gate portion 23, and outer leads 41. However, each of them does not have the chip mounting portion 2, inner leads 42, and most part of the chip mounting portion supporting members 18. A portion hatched in FIG. 14A indicates the upper lead frame 32 fixed on the main lead frame 31. The lower lead frame 33 has the same pattern as that of the upper lead frame 32.

After the chip is mounted on the lead frame and the resin molding process is effected, the lead frames 32, 33 are removed. Thus, a semiconductor device having a gull-wing type package which is similar to that of the conventional case can be formed.

The semiconductor device of this invention can be set perpendicular to and mounted on the circuit board as shown in FIG. 11, but when the semiconductor devices are mounted on the circuit board. 9 as shown in FIGS. 15, 16, they can be stacked (FIG. 15) or they can be arranged in a matrix form (FIG. 16). In either case, since the lead does not project from the package, the mounting density of the package in a plane or space can be improved. For example, when the semiconductor device of this invention is mounted on a circuit board so as to be incorporated into a memory card, the packages can be arranged at a shorter distance than in the conventional case and the chips can be easily stacked since the outer leads are not projected. Further, since the thickness of the outer leads is used to define the depth of the cavity, the thickness of the package can be easily determined by adequately setting the depth of the cavity.

Figure 1:
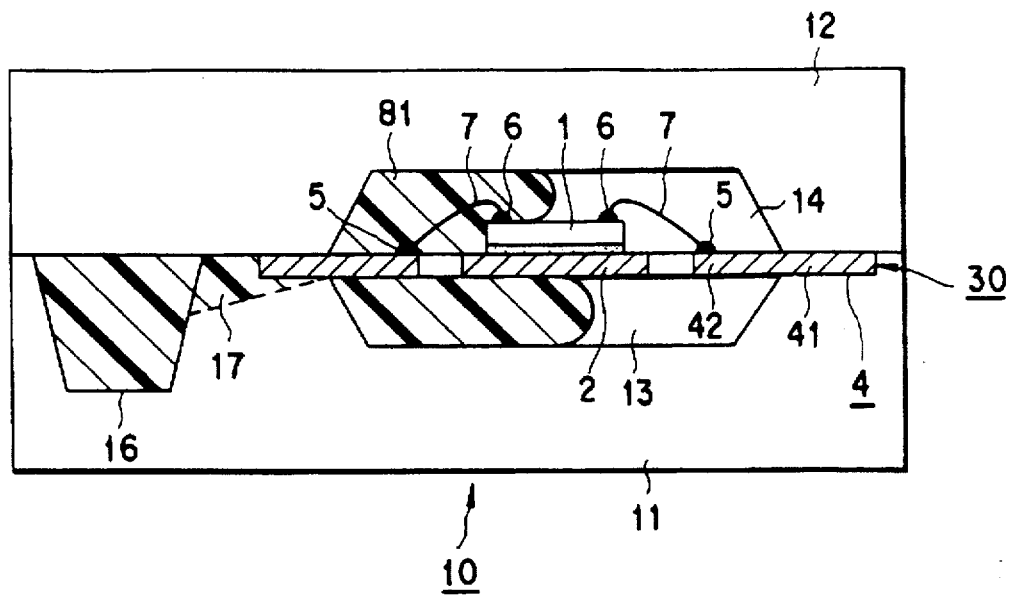
FIG. 1 is a cross sectional view of a conventional mold forming metallic mold in which a lead frame having a semiconductor chip mounted thereon is disposed.
Figure 2:
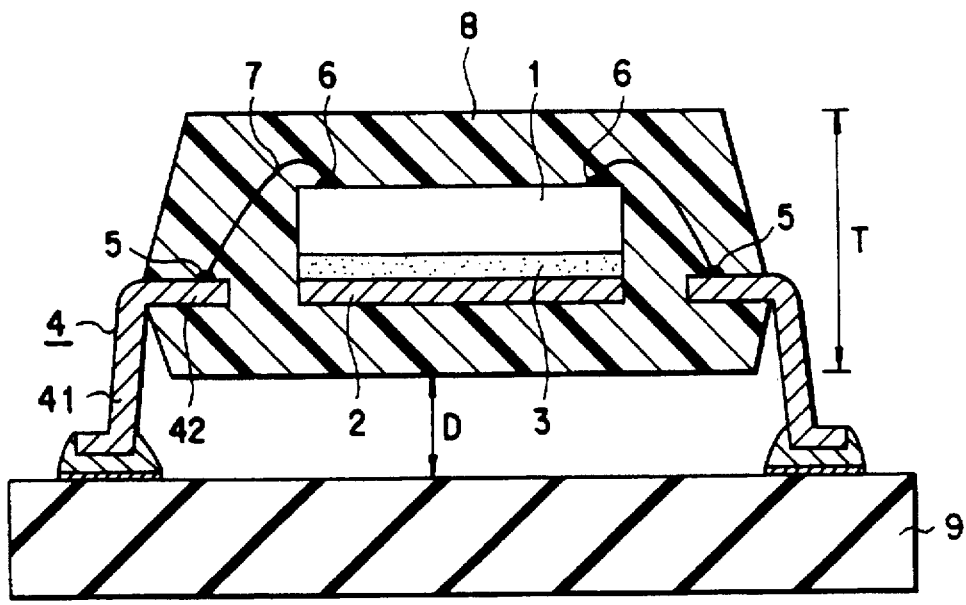
FIG. 2 is a cross sectional view of a conventional semiconductor device mounted on a circuit board.
Figure 3:
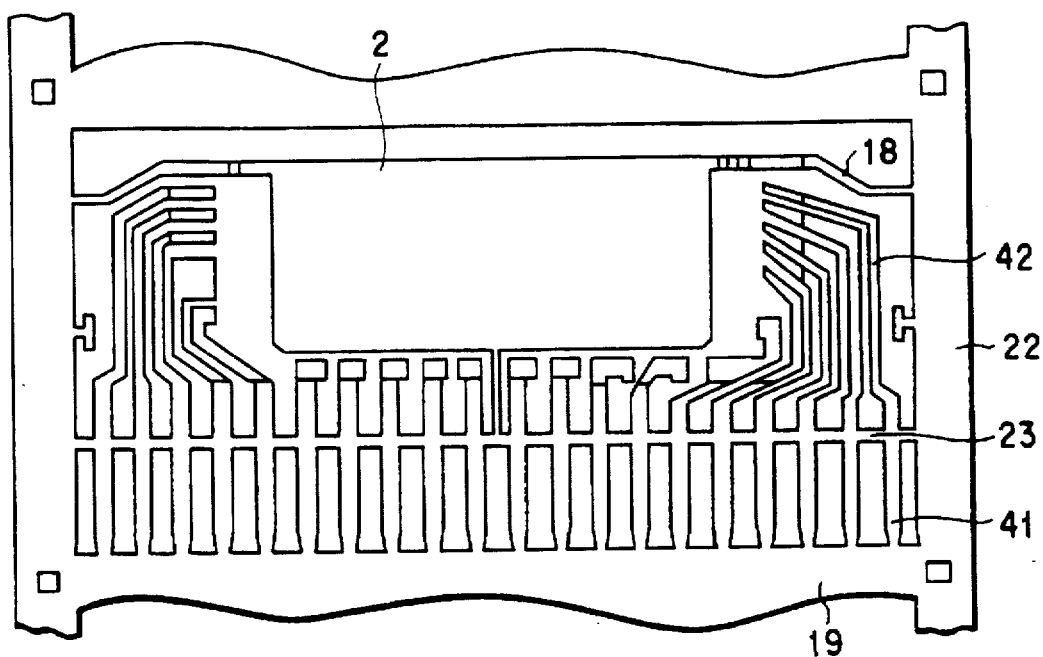
FIG. 3 is a plan view of a conventional lead frame.

The conventional lead frame generally has substantially a constant thickness. As shown in FIG. 3, the tie bar 23 is formed between the outer leads 41 and the inner leads 42 in addition to the tie bar 19 for supporting the outer leads 41 so as to enhance the mechanical strength of the leads. However, in the lead frame of this invention, as shown in FIGS. 7A to 7C, for example, since a portion such as the frame, outer leads, the tie bars connected to the outer leads which surround the chip mounting portion and inner leads is formed thick, it is not necessary to reinforce the leads by forming an additional tie bar near the inner leads.

According to this invention of the above construction, it becomes unnecessary to project the outer leads from the package over a long distance, and therefore, the problem of bending of leads can be solved. Further, the chip can be connected to the circuit board or the chips can be connected to each other by soldering by use of the outer leads exposed in the surface of the package and the mounting area can be reduced. In addition, by using a mold forming mold of novel structure, the thickness of the package can be made equal to the thickness of the thick portion of the lead frame and the spatial mounting density can be enhanced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing semiconductor devices, comprising:

a step of mounting a semiconductor chip on a lead frame, inserting said lead frame between facing flat surfaces of a cope and a drag constructing a mold, and forming a cavity by use of the flat surfaces of said mold, and frame portions, tie bars and outer leads of said lead frame;

a step of injecting mold resin into said cavity and curing the same to form a package of mold resin; and a step of taking out said lead frame from said mold, cutting off peripheral portions of the resin mold of said lead frame to expose the same in an upper surface, lower surface and side surface of said package, thus forming the outer leads whose surfaces make substantially the same plane as upper, lower and side surfaces of said package.

2. A method for manufacturing semiconductor devices according to claim 1, further comprising a step of forming a runner and a gate for supplying the mold resin into said cavity in said mold or in the frame portion of said lead frame.

3. A method for manufacturing semiconductor devices according to claim 1, further comprising a step of forming a projecting portion which abuts against the cope of said mold and has substantially the same thickness as or slightly higher than the outer leads, tie bars, and frame portions of said lead frame on the drag of said mold.

4. A method for manufacturing semiconductor devices according to claim 1, wherein the height of a chip mounting portion and inner leads is less than that of said outer leads, tie bars, and frame portions and the height of said outer leads, tie bars, and frame portions is substantially the same.

5. A method for manufacturing semiconductor devices according to claim 2, wherein the height of a chip mounting portion and inner leads is less than that of said outer leads, tie bars, and frame portions and the height of said outer leads, tie bars, and frame portions is substantially the same.

6. A method for manufacturing semiconductor devices according to claim 3, wherein the height of a chip mounting portion and inner leads is less than that of said outer leads, tie bars, and frame portions and the height of said outer leads, tie bars, and frame portions is substantially the same.

* * * * *